United States Patent [19]

Sullivan et al.

[11] Patent Number: 5,301,150
[45] Date of Patent: Apr. 5, 1994

[54] FLASH ERASABLE SINGLE POLY EPROM DEVICE

[75] Inventors: Stephen F. Sullivan, Rescue; Neal R. Mielke, Los Altos Hills, both of Calif.

[73] Assignee: Intel Corporation, Santa Clara, Calif.

[21] Appl. No.: 901,736

[22] Filed: Jun. 22, 1992

[51] Int. Cl.$^5$ .............................................. G11C 11/40
[52] U.S. Cl. .................................. 365/185; 257/300; 257/313; 257/315; 257/316
[58] Field of Search ...................... 365/149, 185, 900; 257/318, 300, 308, 313, 326, 328, 371, 314, 315, 316, 317

[56] References Cited

U.S. PATENT DOCUMENTS

| | | | |
|---|---|---|---|
| 4,425,631 | 1/1984 | Adam | 257/318 |
| 4,649,520 | 3/1987 | Eitan | 257/318 |
| 4,661,833 | 4/1987 | Mizutani | 257/318 |
| 4,924,278 | 5/1990 | Logie | 257/318 |
| 4,970,565 | 11/1990 | Wu et al. | 257/318 |
| 5,042,008 | 8/1991 | Iwasa et al. | 365/185 |

FOREIGN PATENT DOCUMENTS

8602779  5/1986  PCT Int'l Appl.

OTHER PUBLICATIONS

Reza Kazerounian and Boaz Eitan, "A Single Poly Eprom for Custom CMOS Logic Applications," IEEE 1986 Custom Integrated Circuits Conference, pp. 59–62.

Kuniyoshi Yoshikawa et al., "An EPROM Cell Structure for EPLD'S Compatible with Single Poly-Si Gate Process," *IEEE Transactions on Electron Devices,* vol. 37, No. 3, Mar. 1990, pp. 675–679.

Scott Frake et al., "A 9ns, Low Standby Power CMOS PLD with a Single-Poly EPROM Cell," Session 15: High-Speed Digital Circuits, 1989 IEEE International Solid-State Circuits Conference, Feb. 17, 1989, pp. 230–231 and 346.

David H. K. Hoe et al., "Cell and Circuit Design for Single-Poly EPROM," *IEEE Journal of Solid-State Circuits,* vol. 24, No. 4, Aug. 1989, pp. 1153–1157.

N. Matsukawa et al., "A High Density Single-Poly Si Structure EEPROM with LB (Lowered Barrier Height) Oxide for VLSI's," Symposium on VLSI Technology, Digest of Technical Papers, Business Center Academic Society Japan, Tokyo, Japan, pp. 100–101, 1985.

Jun-ichi Tsujimoto et al., "A 5V-Only 256K CMOS EEPROM using Barrier Height Lowering Technique," ESSCIRC '85, 11th Solid State Circuits Conference, Univ. Paul Sabatier, Toulouse, France. Sep. 16–18 1985, pp. 241–244.

Kenneth J. Schultz et al., "A Microprogammable Processor Using Single Poly EPROM," *Ingegration,* VLSI journal 8, 1989, pp. 189–199.

Philip J. Cacharelis et al., "A Fully Modular 1 μm CMOS Technology Incorporating EEPROM, EPROM and Interpoly Capacitors," ESSDERC 90, Nottingham, Sep. 1990, pp. 547–550.

Kuniyoshi Yoshikawa et al., "An EPROM Cell Structure for EPLDs Compatible with Single Poly Gate Process," 1986 Int'l Conf. on Solid State Devices and Materials, Tokyo, 1986, pp. 323–326.

T-I. Liou et al., "A Single-Poly CMOS Process Merging Analog Capacitors, Bipolar and EPROM Devices," pp. 37–38.

*Primary Examiner*—Eugene R. LaRoche
*Assistant Examiner*—Vu A. Le
*Attorney, Agent, or Firm*—Blakely, Sokoloff, Taylor & Zafman

[57] ABSTRACT

A single polysilicon layer electrically programmable and electrically erasable read only memory cell is described. The cell utilizes an n-well inversion capacitor, formed in a semiconductor substrate as the control gate. One plate of the capacitor is formed from the same polysilicon layer as the floating gate of the memory device, thus capacitively coupling the floating gate and the inversion capacitor control gate. Additional erase performance is achieved by addition of a dedicated erase capacitor to the basic cell. Still further improvement in programming performance and protection against over-erase failure in a flash type EEPROM device is achieved by the addition of a select transistor. Prevention of program disturb and DC erase is also described.

46 Claims, 5 Drawing Sheets

FLASH ERASABLE SINGLE POLY EPROM DEVICE

BACKGROUND OF THE INVENTION

1. Field Of The Invention

The present invention relates to the field of electrically programmable and electrically erasable MOS devices.

2. Prior Art

Numerous read-only memories employing floating gate memory cells are well-known and commercially available. Typically, these memories are fabricated with MOS technology. Each cell includes a polycrystalline silicon (polysilicon) floating gate which is completely surrounded by electrical insulation such as silicon dioxide. Various mechanisms are used to transport charge onto the floating gate and to remove the charge from this gate. In one class of memories (EPROMs), charge is transported to the floating gate through channel hot electron injection or avalanche injection and is removed by exposing the memory to ultraviolet radiation. Another class of memories, EEPROMs, may be electrically erased as well. EEPROMs utilize a thin oxide between the floating gate and the substrate through which charge is tunneled onto and from the floating gate. In both types of devices, a second polysilicon control gate is generally employed. The control gate is electrically coupled to a supply potential and is generally used during reading and writing operations.

It is desirable to implement memory cells such as those described above on logic manufacturing technologies, so that logic functions and memory elements can be incorporated on a single chip, to form electrically programmable logic devices (EPLDs). Use of EPROM-like cells on logic technologies enhances the performance of the logic devices by allowing them to be custom configured by the user. One problem with the above-described EPROM and EEPROM technologies is that two layers of polysilicon are usually required, one for the floating gate and one for the control gate. However, double polysilicon processing is not otherwise required to manufacture MOS or CMOS logic circuits. Therefore, implementing a double poly-EPROM on current logic manufacturing technologies greatly increases processing complexity, thereby increasing costs and reducing yields.

Recently, a single polysilicon layer EPROM has been proposed (see "A Single Poly-EPROM for Custom CMOS Logic Applications" by R. Kazerounian and B. Eitan, IEEE/CICC 1986). In that paper, a memory cell utilizing a single polysilicon floating gate is described. The cell includes a floating gate n-channel transistor and a control gate. The "control gate" is an n-well which is capacitively coupled to the floating gate. The single poly-EPROM is programmed by channel hot electron injection into the floating gate and erased by exposure to UV light.

While the above memory element is compatible with single polysilicon CMOS technology, it is further desirable to produce a CMOS compatible memory cell which is electrically erasable as well as electrically programmable. It is further desirable that the memory cells should be capable of preventing "over-erase" mechanisms which occur in "flash" type devices. Finally, the memory cell should be capable of preventing "program disturb" and "D.C. erase" problems which occur in flash type devices.

SUMMARY OF THE INVENTION

An electrically erasable and electrically programmable single polysilicon layer read only memory cell is disclosed. The cell of the present invention requires only one polysilicon layer, which is used to form the floating gate. Because only one polysilicon layer is required, the device can be implemented on current CMOS technologies without additional processing complexity. The control gate of the cell is an inversion capacitor which includes an n-well which is capacitively coupled to a polysilicon member. The polysilicon member serves as the floating gate of the memory cell. The cell of the present invention is erased via Fowler-Nordheim tunneling through a thin layer of silicon dioxide.

Additional embodiments including one with a dedicated PMOS tunneling capacitor to improve erase performance, and an embodiment including a select gate to allow reading of a memory cell on the same bit line as an over-erased cell are disclosed.

DETAILED DESCRIPTION OF THE PREFERRED EMBODIMENT

A single polysilicon layer electrically erasable and electrically programmable read only memory cell is described. In the following description, numerous specific details are set forth such as dopant type, dopant levels, voltages, etc. in order to provide a thorough understanding of the present invention. It will be obvious, however, to one skilled in the art that these specific details need not be employed to practice the present invention. In other instances, well-known processing steps and methods are not described in detail in order to avoid unnecessarily obscuring the present invention.

Figure 1:
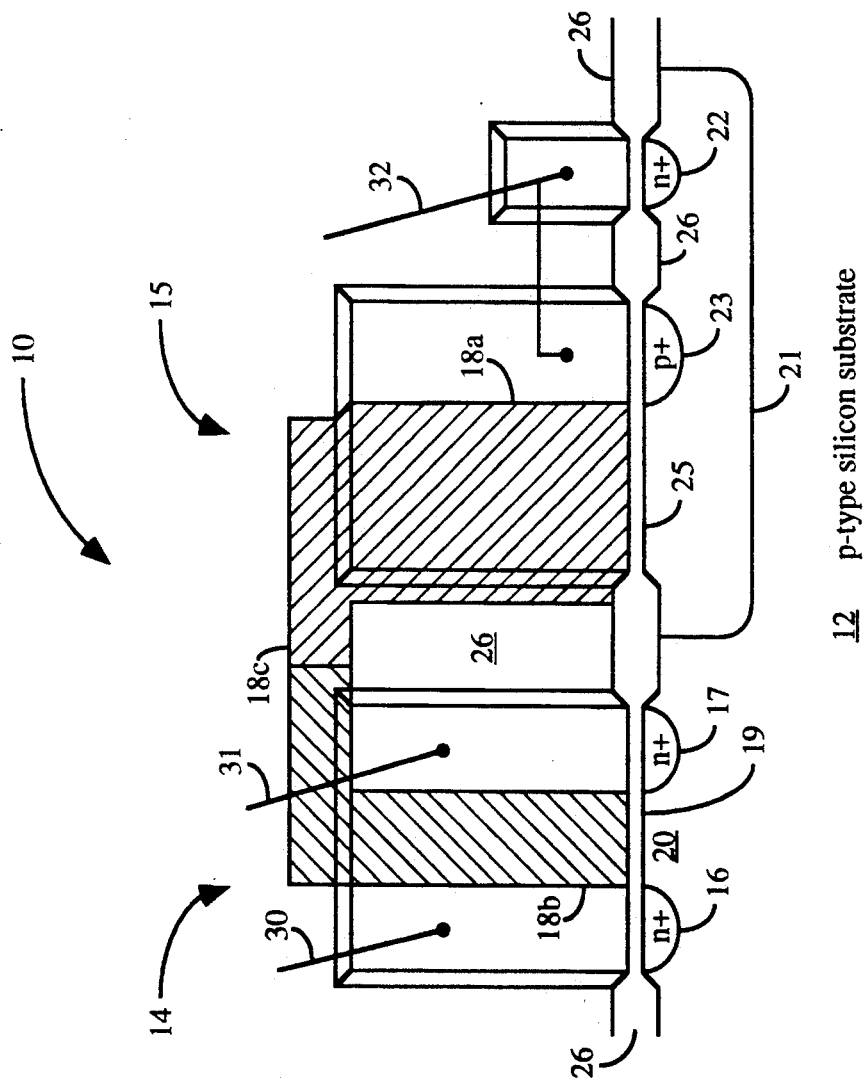
FIG. 1 is a three-dimensional, cross-sectional view of the electrically programmable and electrically erasable single polysilicon layer cell of the present invention.

FIG. 1 shows a currently preferred embodiment of the memory cell 10 of the present invention during fabrication. Memory cell 10 is fabricated on p-type silicon substrate 12 in a currently preferred embodiment. Although a currently preferred embodiment is described in conjunction with p-type silicon substrate 12, it will be appreciated by one skilled in the art that the memory cell 10 could be fabricated on an n-type substrate, using the opposite dopant types for the diffusion regions and wells as those described below. However, very high voltages would be required for such a cell formed on an n-type substrate. In addition, for the specific embodiments described below, specific voltage levels are given for programming, reading, and erasing the embodiments described below. It will be obvious to one skilled in the art, however, that other embodiments within the scope of the claims may require different voltage levels to perform these functions depending upon the exact dimensions, doping levels, and desired performance characteristics.

Memory cell 10 comprises transistor 14 and control gate capacitor 15. Transistor 14 and capacitor 15 share polysilicon member 18 which serves as the floating gate of transistor 14 and as a plate of capacitor 15. In a currently preferred embodiment, polysilicon member 18 is a single, continuous, heavily doped polysilicon member comprising the portion 18a which serves as the plate of capacitor 15, portion 18b which serves as the floating gate of transistor 14, and portion 18c which electrically couples portions 18a and 18b. Although polysilicon member 18 is a single, continuous polysilicon member, in the following description it will also be referred to as the floating gate 18b and capacitor plate 18a depending upon the context. Also, in an alternative embodiment, in place of the single polysilicon member 18, a separate floating gate corresponding to portion 18b and separate plate corresponding to portion 18a coupled by any type of conductive interconnect could be utilized. This alternative would generally require additional processing. Also, the dielectric surrounding any such interconnect must be of high integrity to prevent charge from leaking off of the interconnect.

In a currently preferred embodiment, transistor 14 is a short channel enhancement NMOS transistor which comprises source 16, drain 17, floating gate 18b, gate oxide 19 and channel region 20. In a currently preferred embodiment, source 16 and drain 17 are heavily-doped n-type diffusion regions doped with a suitable n-type dopant such as phosphorous or arsenic to a level in the range of approximately $10^{20}$ atoms/cm$^3$. Also, in a currently preferred embodiment, conventional lightly doped drain (LDD) processing is utilized, resulting in lightly doped regions on both sides of the channel 20. The LDD regions actually limit erase performance, and most memory processes are designed to avoid making LDD regions. However, in a currently preferred embodiment, where a memory cell is being implemented on logic manufacturing technologies, the LDD regions are required by the logic manufacturing process. The width of channel 20 between source 16 and drain 17 is in the range of approximately 1.3 microns. The length of channel 20 is in the range of approximately 0.4 micron. Also, in a currently preferred embodiment, the thickness of gate oxide 19 is in the range of approximately 50–150 Å. Gate oxide 19 is formed by thermal oxidation. Alternatively, a nitridized dielectric could be used. Portion 18b of polysilicon member 18 which forms the floating gate of transistor 14, is heavily-doped n-type to a concentration in the range of approximately $10^{20}$ atoms/cm$^3$. Portion 18b of polysilicon member 18 is doped at the same time as regions 16, 17, and 22.

Capacitor 15 of memory cell 10 is a PMOS inversion capacitor in a currently preferred embodiment. Capacitor 15 comprises well 21, diffusion regions 22 and 23, and thin oxide 25. As described above and as can be seen from FIG. 1, transistor 14 shares its floating gate with capacitor 15. Portion 18a of polysilicon member 18 overlying well 21 serves as the plate of capacitor 15. Plate 18a of polysilicon member 18 is heavily doped p-type to a concentration in the range of $10^{20}$ atoms/cm$^3$. The interface between n-type and p-type portions of polysilicon member 18 generally can be anywhere along the portion marked 18c connecting gate 18b and plate 18a, taking care to prevent counter-doping of, for example, drain 17. In FIGS. 1–4, the portions of the polysilicon members shown therein are cross-hatched in one direction for the portions which are doped n-type, and cross-hatched in the other direction for the portions which are doped p-type. The entire polysilicon member in FIGS. 1–4 could be doped either all p-type or all n-type if desired. In general, n-type is preferred as it provides a better source of tunneling electrons. The doping occurs in a currently preferred embodiment as shown in FIGS. 1–4 due to processing considerations.

Plate 18a overlying well 21 is capacitively coupled to well 21. Due to this capacitive coupling, well 21 is able to function as the control gate of the memory cell 10 as will be described below. In a currently preferred embodiment, well 21 is an n-well doped with the suitable n-type dopant to a level in the range of approximately $10^{17}$ atoms/cm$^3$. Heavily-doped region 22 is doped with an n-type dopant to a level in the range of approximately $10^{20}$ atoms/cm$^3$. Region 22 is doped at the same time as other n+ regions such as regions 16 and 17, as well as gate 18b. As will be discussed below, region 22 serves as a contact region for making electrical contact to capacitor 15. Region 23 serves as a source of minority carriers to prevent well 21 from going into deep depletion during programming. In a currently preferred embodiment, region 23 is heavily doped with a p-type dopant to a concentration in the range of $10^{20}$ atoms/cm$^3$. Region 23 is doped at the same time as plate 18a. Thin oxide 25 has a thickness in the range of approximately 50–150 Å. Finally, thick oxide 26 is the field isolation oxide which electrically isolates capacitor 15, transistor 14, diffusion regions 22 and 23 within memory cell 10, and isolates memory cell 10 from other cells or devices. In a currently preferred embodiment, the thickness of thick oxide layer 26 is in the range of approximately 3000 Å. Also in a currently preferred embodiment, the area of a capacitor 15 is in the range of approximately $5\mu^2$.

Figure 2:
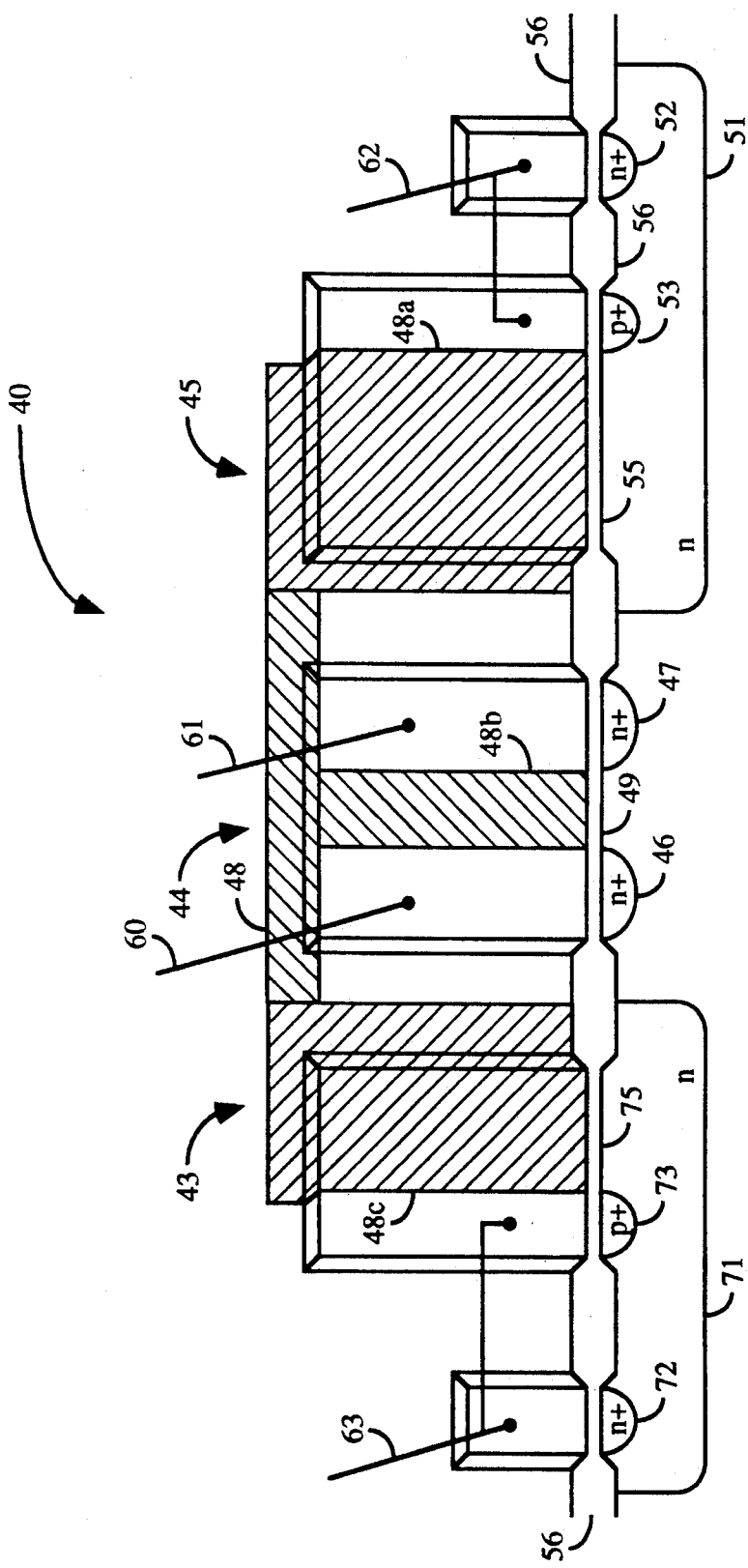
FIG. 2 shows an alternative embodiment of the present invention which also includes a dedicated capacitor for erase.
Figure 3:
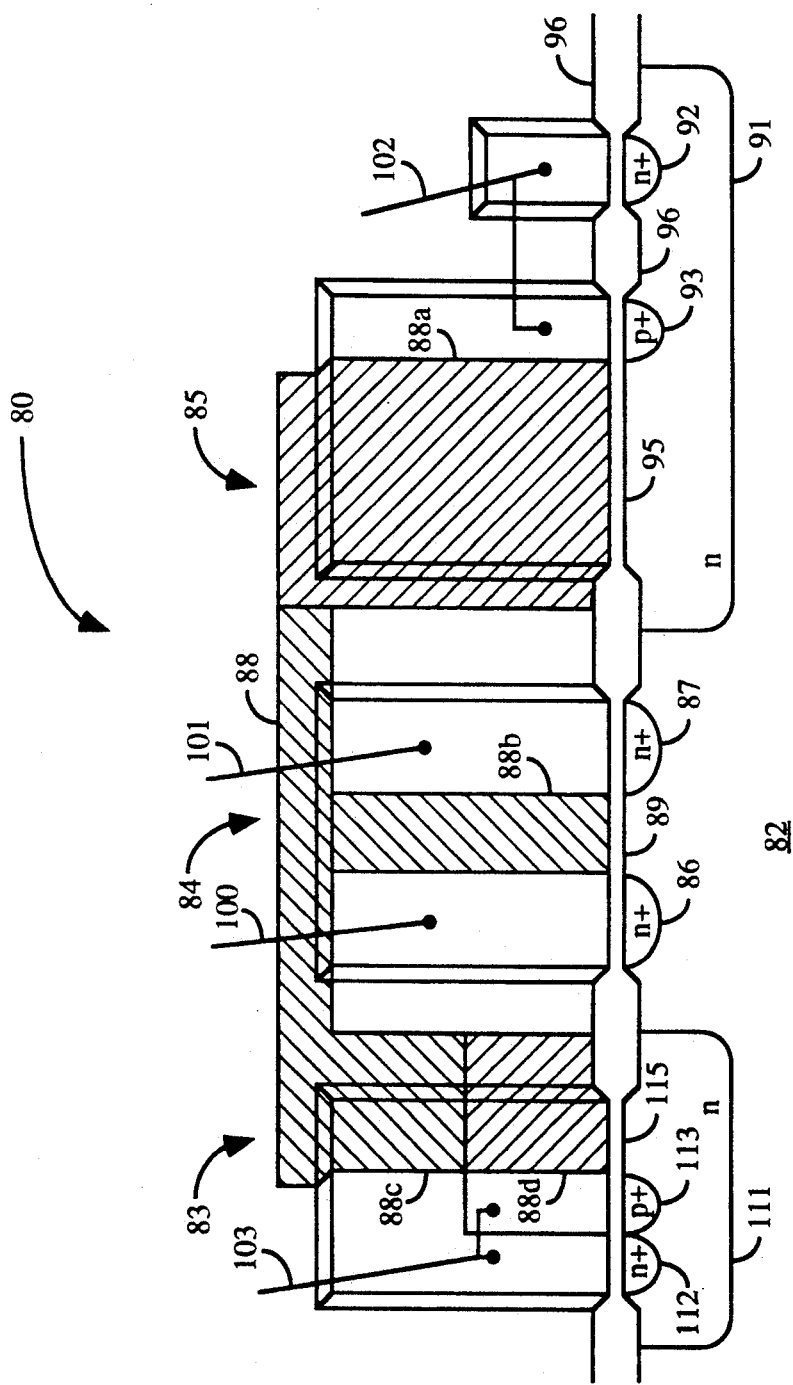
FIG. 3 shows a second alternative embodiment of the present invention wherein the plate of the erase capacitor has a portion that is doped n-type and a portion that is doped p-type.
Figure 4:
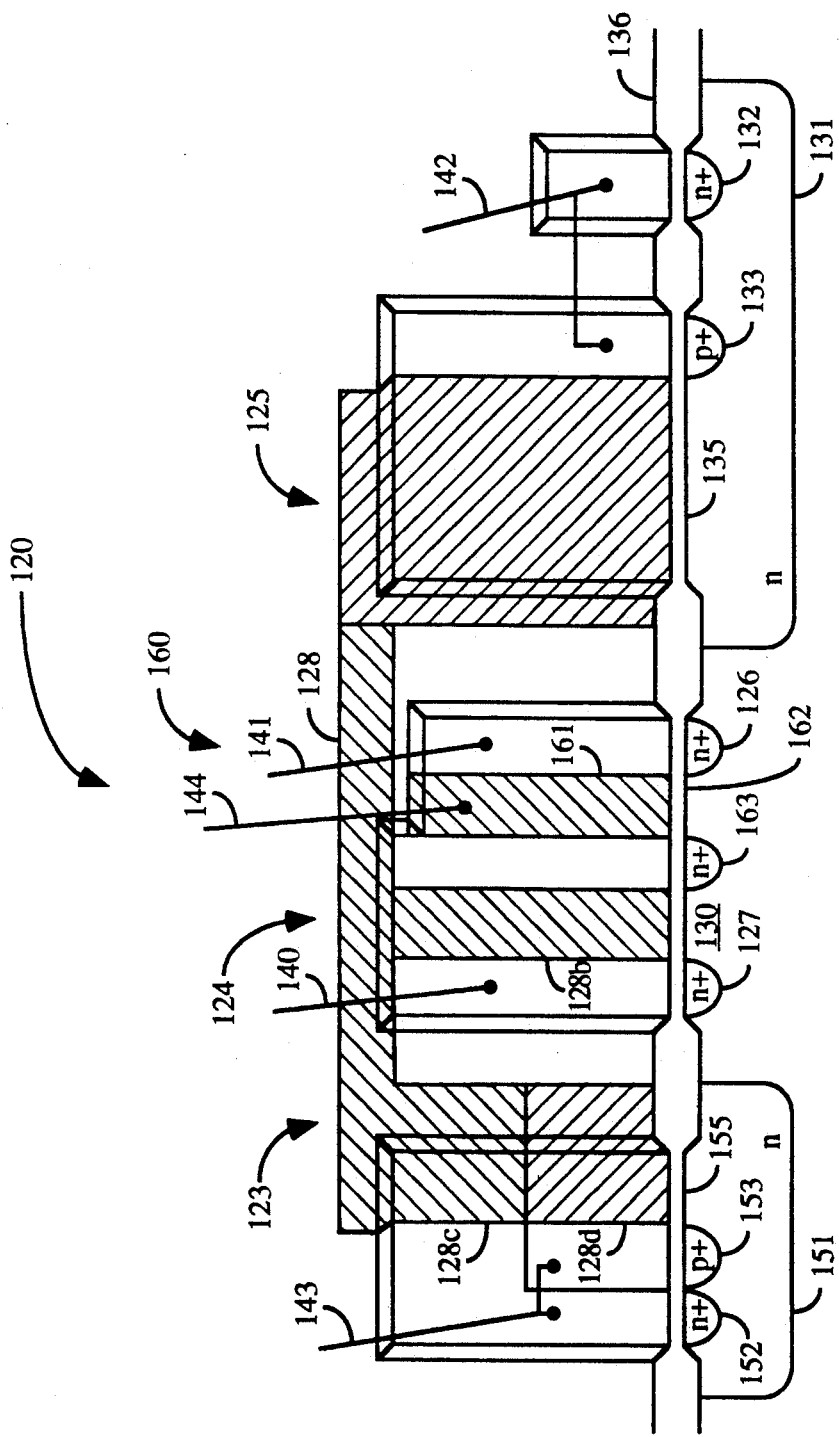
FIG. 4 shows a third alternative embodiment of the present invention additionally including a select transistor.

The structure of FIG. 1 is fabricated using methods well-known in the art. After the stage of processing shown in FIG. 1, another dielectric layer is formed over the structure of FIG. 1. Contact openings through the dielectric layer, and through any other oxide or insulative layers, for example, gate oxide 14, to the various contact regions are then made followed by one or more metalization layers, and finally a passivation layer as is well-known in the art. Also, contact regions such as source 16, drain 17, regions 22 and 24, as well as all of polysilicon members 18, are silicided to ensure conductivity. In addition, all similar structures on other parts of the substrate not shown in FIG. 1, as well as in the embodiments shown in FIGS. 2–4, are silicided as will be appreciated by one skilled in the art. In memory cell 10, electrical contact is made to source 16, drain 17 and regions 22 and 23. Electrical contact to these regions is shown schematically by contact lines 30, 31 and 32 which contact source 16, drain 17 and regions 22 and 23 of FIG. 1 respectively. No contact is made to polysilicon member 18. That is, polysilicon member 18 is completely surrounded by an insulative layer.

In memory cell 10, well 21 performs the same functions as the control gate of the prior art device. In a prior art device, the control gate is made of a second polysilicon layer disposed above and electrically isolated from the floating gate. As described earlier, the second polysilicon layer is not compatible with logic processing technology. Memory cell 10 of FIG. 1 is completely compatible with standard MOS logic fabrication technology.

Memory cell 10 is programmed by hot electron injection into the floating gate. To program cell 10 in a currently preferred embodiment, approximately 7 volts is applied to drain 17 through contact 31 and approximately 7 volts is applied to n-well 21 through contact 32 while the source and the substrate are grounded. Under these conditions, hot electrons are generated in channel 20 which have sufficient energy to penetrate gate oxide 19. These hot electrons are attracted to floating gate 18b due to the electric field created by capacitor 15. The resultant voltage on floating gate 18 ($V_{FG}$) is $$V_{FG} = G_{CR} * V_{CG}$$

where $V_{CG}$ is the voltage placed on n-well 21 and $G_{CR}$ is the gate coupling ratio and is given by the formula:

$$G_{CR} = \frac{C_{CAP}}{C_{GATE} + C_{CAP} + C_{PAR}}$$

where $C_{CAP}$ equals the capacitance of capacitor 15, $C_{GATE}$ equals the capacitance between floating gate 18b and channel 20 and $C_{PAR}$ is the sum of all parasitic capacitances such as the capacitance between portion 18c of polysilicon member 18 and, for example, the substrate through thick oxide 26.

As mentioned above, region 23 provides a source of minority carriers, which prevents the well 21 from going into deep depletion during programming. If this were to occur, the capacitance of capacitor 15 and therefore the gate coupling ratio would be degraded. The programming of memory cell 10 is a function of the effective length of channel 20, the gate coupling ratio, and the applied voltages. Programming time depends strongly on the voltage applied to drain 17, while the final program voltage, $V_{PG}$ is strongly dependent on the voltage applied to well 21.

To erase memory cell 10, well 21 is grounded and a potential of approximately 7–10 V is applied to source 16 while drain 17 floats. Under these conditions, an electric field of sufficient magnitude is developed to cause electrons to tunnel from floating gate 18 to source 16 through gate oxide 19. (Fowler-Nordheim tunneling). As mentioned earlier, the tunneling in this cell occurs through a lightly-doped diffusion (LDD) of source 17, which is not shown in FIG. 1. The proper voltages to be used in this and other embodiments of the present invention will depend upon the thickness of the oxide through which the electrons must tunnel, the desired performance characteristics, and other factors.

To read memory cell 10, a "read" potential (i.e., a voltage between the threshold voltage of an unprogrammed cell and the threshold voltage of a programmed cell) is placed on the control gate. Sensing circuits then sense whether current flows between the source 16 and drain 17. If there is a current between source 16 and drain 17, the cell is considered unprogrammed. If no appreciable current flows, the cell is considered programmed.

FIG. 2 shows another preferred embodiment of the present invention. Memory cell 40 comprises transistor 44, control gate capacitor 45 and erase capacitor 43. Transistor 44 and capacitor 45 are similar in structure and function to transistor 14 and capacitor 15 of memory cell 10 of FIG. 1. As in memory cell 10, the polysilicon member 48 of memory cell 40 is shared by transistor 44 and capacitor 45. Additionally, polysilicon member 48 has an additional segment, shown as segment 48c which forms a plate of capacitor 43. The structure and performance of memory cell 40 with regard to transistor 44 and capacitor 45 are similar to the structure and performance of memory cell 10, except for erasing as described below.

In memory cell 40 of FIG. 2, capacitor 43 performs the erasing function. Capacitor 43 comprises well 71, diffusion regions 72 and 73, thin oxide 75 and portion 48c of polysilicon member 48. In a currently preferred embodiment, well 71 is an n-well doped to a level in the range of approximately $10^{17}$ atoms/cm$^3$. Region 72 is a heavily-doped n-type region doped to a concentration in the range of approximately $10^{20}$ atoms/cm$^3$. Region 73 is a heavily-doped p-type region doped to a concentration in the range of approximately $10^{20}$ atoms/cm$^3$. Thin oxide 75 is a thermal oxide grown to a thickness in the range of approximately 50–150 Å. Also in a currently preferred embodiment, capacitor 43 has an area in the range of approximately 1.0$\mu^2$. Thick oxide 56 electrically isolates capacitor 43 from other portions of memory cell 40 as well as from other cells in an array or from other devices. Optionally, thick oxide 56 can separate regions 72 and 73 as shown in FIG. 2. However, if desired, regions 72 and 73 can be placed together without a portion of thick oxide 56 between them. Region 73 is used as a source of minority carriers to prevent well 71 from going into deep depletion during erase. In a currently preferred embodiment, portion 48c of polysilicon member 48 overlying well 71 is heavily-doped with a p-type dopant to a concentration in the range of approximately $10^{20}$ atoms/cm$^3$. Again, to reduce processing, portion 48c of polysilicon member 48 is doped at the same time as region 73. As with memory cell 10, portion 48b of polysilicon member 48 is heavily-doped with an n-type dopant and portion 48a is heavily-doped with a p-type dopant.

In the embodiment shown in FIG. 2, capacitor 43 is a PMOS tunneling capacitor and is a dedicated erase capacitor for memory cell 40. Memory cell 40 is erased by applying a potential in the range of approximately 7–10 volts to well 71. The potential is applied to regions 72 and 73 as shown schematically by contact 63. During erase, well 51, source 46, and drain 47 are grounded. Because erase capacitor 43 has a relatively small area, it has a low coupling ratio. This causes most of the voltage applied to well 71 to fall across oxide 75 rather than oxide 49 (as occurs with capacitor 45 when a voltage is applied to well 51). This high voltage oxide 75 causes electrons to tunnel from plate 48c to well 71 during erase. The dedicated erase capacitor 43 for memory cell 40 improves the erase performance over memory cell 10 of FIG. 1. First, the tunneling current is improved for a given applied erase voltage since the voltage drop across the tunneling oxide (oxide 75) is not limited by the LDD as is the case in memory cell 10, where the LDD depletes when an erase voltage is applied to source 16, thereby reducing the voltage across oxide 19 of cell 10. In cell 10, additional processing would be required to form devices without the LDD in the array in order to overcome the limitation the LDD places on erase performance. Also, the fact that the high voltage node for erase is now an n-well instead of an MOS source diffusion allows for a higher erase voltage to be applied without the risk of breakdown. That is, the breakdown voltage of the well 71 of FIG. 2 (approximately 20 volts) is higher than that of source 16 of FIG. 1 (approximately 7-8 volts). This is due to the fact that the source 16 is much more heavily-doped than well 71.

FIG. 3 shows another preferred embodiment of the present invention. The memory cell 80 of FIG. 3 has transistor 84, control gate capacitor 85, erase capacitor 83 and is essentially the same as memory cell 40 of FIG. 2, except now the portion of the polysilicon segment overlying the erase capacitor 83 has both a portion heavily-doped n-type and a portion heavily-doped p-type. Referring to FIG. 3, the portion shown as 88d is heavily-doped p-type, to a concentration in the range of approximately $10^{20}$ atoms/cm$^3$. The portion shown as 88c is heavily-doped n-type to a concentration in the range of $10^{20}$ atoms/cm$^3$. As shown in FIG. 3, n+ contact region 112 and p+ region 113 are disposed next to one another in a currently preferred embodiment. As shown, electrical contact is made to well 111 through contact 103, which contacts both regions 112 and 113. Erase capacitor 83 is a "hybrid capacitor" in that there is both n-type and p-type portions of the plate. Alternatively, capacitor 83 could be a "simple capacitor" having a plate of a single dopant type such as is shown for capacitor 43 of FIG. 2. As with the previous embodiments, all n+ diffusion regions and n+ polysilicon segments are doped at the same time in one processing step (i.e., regions 86, 87, 92 and 112 and polysilicon segments 88b and 88c), and all p+ diffusion regions and p+ polysilicon segments are doped at the same time in another processing step. Memory cell 80 of FIG. 3 has improved erased performance over memory cell 40 of FIG. 2 since the n+ segment 88c is a better source of tunneling electrons for erase than the p+ segment 48c of memory cell 40. Alternatively, all of polysilicon member 88 could be doped n+ in a separate processing step to provide a source of electrons for tunneling. However, this approach would not be compatible with the above described "complementary polysilicon processing" wherein polysilicon segments are doped the same type as adjacent source, drain and similar diffusion regions, and would therefore require additional processing.

FIG. 4 shows a further preferred embodiment of the present invention. Memory cell 120 of FIG. 4 is similar to memory cell 80 of FIG. 3, except that in addition to having a transistor 124, control gate capacitor 125 and erase capacitor 123, memory cell 120 also has select transistor 160. Region 163 serves as the source of transistor 124 and the drain of transistor 160. It will be referred to as source 163 or drain 163 depending upon the context. Transistor 124 includes source 163 and drain 127. Select transistor 160 includes select gate 161, select gate oxide 162, source 126 and drain 163. Select gate 161 comprises heavily doped n-type polysilicon in a currently preferred embodiment. Select transistor 160 provides for improved programming performance as well as for protection against over-erase mechanisms.

To program memory cell 120, both wells 131 and 151 are brought to a potential in the range of approximately 7 V through contacts 142 and 143 respectively. As with memory cell 80 of FIG. 3, erase capacitor 123 can be either a simple capacitor or hybrid capacitor as shown. Drain 127 is biased high to a potential in the range of approximately 7 V, and source 126 is grounded. Select transistor 160 is turned on by applying potential in the range of approximately 3.3 volts to select gate 161 through contact 144, thus allowing current to flow through transistor 124. Under these conditions, avalanche breakdown in channel 130 will occur, and the hot electrons generated will penetrate gate oxide 129 and be attracted to floating gate 128b. Memory cell 120 is erased in substantially the same manner as memory cell 80 of FIG. 3.

To read memory cell 120, a potential is applied between source 126 and drain 127. The control gate (i.e., capacitor 125) is turned on by applying a read potential in the range of approximately 3.3 V to well 131 via contact 142. Transistor 160 is turned on by applying a potential in the range of approximately 3.3 to select gate 161. When memory cell 120 is unprogrammed, (i.e., no charge present on floating gate 128b) transistor 124 will be on (since the read potential is greater than the threshold voltage of an unprogrammed cell) and will conduct current that can be sensed. When the memory cell 120 is programmed, transistor 124 will be off (since the read potential is less than the threshold voltage of a programmed cell) and will not conduct current appreciably. Thus, the higher threshold voltage represents a programmed cell and the lower threshold voltage represents an unprogrammed cell. Appropriate sensing circuits can detect whether current flows and, therefore, whether the cell is programmed or unprogrammed.

To illustrate the over-erase problem, reference is made back to memory cell 80 of FIG. 3. A cell may become over-erased whereby current flows through transistor 84 regardless of whether a potential is applied to the control gate (i.e., the threshold voltage is less than or equal to zero). In a flash type device, where several cells in a column share the same bit line (i.e., drain 87 is common to all cells in the column), all cells in the same column as an over-erased cell are unusable. This is because if an attempt is made to read an otherwise functional cell on the same bit line by applying a potential to common drain 87 and the control gate of the functional cell and grounding the common source 86, no difference in threshold voltage between a programmed and an unprogrammed state of the functional cell can be detected since the over-erased cell causes current to flow in the common bit line, causing the sensing circuits to interpret all cells as being in the erased binary state.

Returning to FIG. 4, it can be seen that select transistor 160 will buffer memory cell 120 from an over-erased cell sharing the same bit line. As described above, no current will flow unless a voltage of approximately 3-4 volts is applied to select gate 161. Thus, no current will flow through an over-erased cell which is not selected by turning on its select transistor 160, and another functioning cell in the same column can be read by turning on the select transistor of the functioning cell during read.

The problem of program disturb, wherein a programmed cell (the deselected cell) gets erased during the programming of another cell (the selected cell) on the same bit line, can be virtually eliminated in memory cell 120 by biasing the control gate of the programmed (deselected) cell during programming of the selected cell. Referring again to FIG. 3, assume that the cell 80 is an already programmed cell on the same bit line as a cell to be programmed. Because a cell on the same bit line is being programmed, drain 87 will be biased high. Therefore, in the programmed cell of FIG. 3, a high potential between drain 87 and floating gate 88b will exist (similar to the situation during erase from source 86), causing electrons to tunnel from the floating gate 88b to drain 87, erasing the deselected cell.

In memory cell 120 of FIG. 4, this problem is eliminated by biasing the control gate 125 of all deselected cells on the same bit line as a selected cell being programmed. With the control gate 125 biased high (to approximately the same or slightly higher voltage level of the drain during programming), the voltage difference between the floating gate 128b and drain 127 is greatly reduced, preventing the deselected cell from being erased. Note that this could not be done with memory cell 80 of FIG. 3, because a high bias on the control gates of all cells on the same bit line as a cell being programmed, while protecting programmed deselected cells from being erased, would turn on any deselected cells which were unprogrammed. This is turn would program the previously unprogrammed cells and cause an undesired increase in power consumption. In cell 120 of FIG. 4, however, the control gate of all deselected cells can be biased hight to prevent the erasing of deselected programmed cells, because the presence of the select gate (which is on for the selected cell and off for all others) prevents current from flowing in deselected unprogrammed cells and, therefore, prevents programming of the deselected cells.

Figure 5:
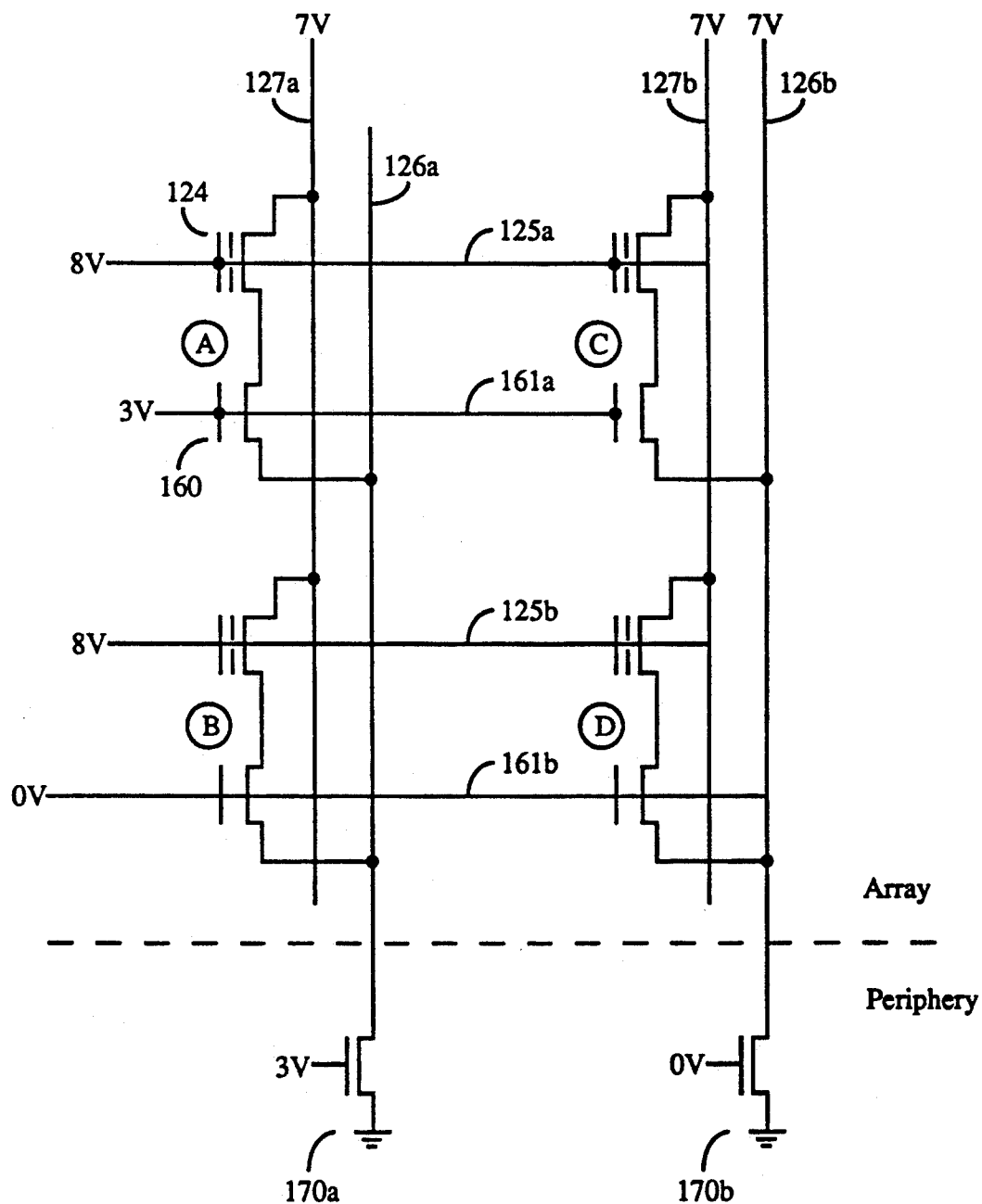
FIG. 5 shows a diagram of a portion of an array of the memory cells of FIG. 4.

Finally, the problem of DC erase/programming can be reduced or eliminated in memory cell 120 with appropriate bias conditions. FIG. 5 illustrates four memory cells 120 in an array. The cells labeled A and B in FIG. 5 are in one column, the cells labeled C and D are in an adjacent column. Cells A and C are in the same row as one another, as are cells B and D. If cell A is being programmed, the select gate 161a and the control gate 125a for that row will be on, as shown by approximate voltages. The source will be grounded by having transistor 170a in the periphery on as shown. As described previously, other control gates, such as control gate 125b, will be on to prevent program disturb in other cells in the same column as cell A. The select gates for these cells, such as 161b, will be off to prevent unintentional programming of unprogrammed cells as discussed previously.

In the adjacent column, containing cells C and D, the problem of DC erase/programming can be illustrated. Since cell C is in the same row as cell A which is being programmed, its select transistor 161a and control gate 125a are both on. Therefore, drain 127b cannot be at, for example 7 V while source 126b is grounded, or else current would flow through cell C, thereby programming cell C. However, if both the source and drain were grounded, then the source, drain, and channel of cell C would be at 0 V, while the control gate is at 8 V. If cell C were programmed, this voltage difference would pull electrons from its floating gate to the control gate 125a, thereby partially or completely erasing cell C (DC erase). If cell C were unprogrammed, the voltage difference between the control gate and channel of cell C would pull electrons from the channel to the floating gate, thereby programming cell C (DC programing). In the present invention, this problem is overcome by use of transistor 170b in the periphery. When transistor 170b is off, as shown, source 126b will float to, for example, 7 V as shown. This prevents any current from flowing between source 126b and drain 127b through cell C. Also, since the source 126b and drain 127b are at 7 V, the voltage difference between the source, drain, and channel of cell C and control gate 125a is eliminated, preventing DC erase or DC programming.

Thus, a single polysilicon layer electrically erasable and electrically programmable memory cell is disclosed. Embodiments utilizing a dedicated erase capacitor and a select transistor are also described. The memory cells of the present invention are fully compatible with logic device manufacturing technology.

What is claimed is:

1. An electrically programmable and electrically erasable floating gate memory device formed on a semiconductor substrate of a first conductivity type comprising:
   a first region of a second conductivity type;
   a second region of said second conductivity type;
   a channel region between said first and said second region;
   a gate dielectric disposed above said channel region;
   a gate disposed above said gate dielectric; and
   a first capacitor, said first capacitor comprising a doped well of said second conductivity type and a plate capacitively coupled to said doped well, said plate being electrically coupled to said gate, wherein said memory device comprises means for electrically programming said memory device and means for electrically erasing said memory device, wherein said means for electrically programming comprise means for applying a first potential to said doped well and means for applying a second potential to said second region, and wherein said means for electrically erasing comprise means for applying a third potential to said first region.

2. The memory device as described in claim 1 wherein said first conductivity type is p and said second conductivity type is n.

3. The memory device as described in claim 2 wherein said doped well comprises a first diffusion region, said first diffusion region being heavily doped with a dopant of said second conductivity type, and a second diffusion region, said second diffusion region being heavily doped with a dopant of said first conductivity type, wherein electrical contact is made to said doped well through means for making electrical contact coupled to said first and said second diffusion regions.

4. The memory device as described in claim 2 wherein said gate and said plate comprise a single, continuous polysilicon layer.

5. The memory device as described in claim 3 wherein said gate and said plate comprise a single, continuous polysilicon layer.

6. An electrically programmable and electrically erasable floating gate memory device formed on a semiconductor substrate of a first conductivity type comprising:
   a first region of a second conductivity type;
   a second region of said second conductivity type;
   a channel region between said first and said second region;
   a gate dielectric disposed above said channel region;
   a gate disposed above said gate dielectric;
   a first capacitor, said first capacitor comprising a first doped well of said second conductivity type and a first plate capacitively coupled to said first doped well, said first plate being electrically coupled to said gate; and
   a second capacitor, said second capacitor comprising a second doped well of said second conductivity type and a second plate capacitively coupled to said second doped well, said second plate being electrically coupled to said gate, said memory device comprising means for electrically programming said memory device and means for electrically erasing said memory device.

7. The device as described in claim 6 wherein said first conductivity type is p and said second conductivity type is n.

8. The memory device as described in claim 7 wherein said first doped well comprises a first and a second diffusion region and said second doped well comprises a third and a fourth diffusion region, said first and said third diffusion regions being of said second conductivity type and said second and said fourth diffusion regions being of said first conductivity type, wherein electrical contact is made to said first doped well through said first and said second diffusion regions and electrical contact is made to said second doped well through said third and said fourth diffusion regions.

9. The memory device as described in claim 7 wherein said means for electrically programming comprise means for applying a first potential to said first doped well and a second potential to said second region, and wherein said means for electrically erasing comprise means for applying a third potential to said second doped well.

10. The memory device as described in claim 8 wherein said means for electrically programming comprise means for applying a first potential to said first doped well and a second potential to said second region, and wherein said means for electrically erasing comprise means for applying a third potential to said second doped well.

11. The memory device as described in claim 7 wherein said gate, said first plate and said second plate comprise a single, continuous polysilicon member.

12. The memory device as described in claim 8 wherein said gate, said first plate and said second plate comprise a single, continuous polysilicon member.

13. The memory device as described in claim 10 wherein said gate, said first plate and said second plate comprise a single, continuous polysilicon member.

14. The memory device as described in claim 11 wherein at least a portion of said second plate is heavily doped n-type.

15. The memory device as described in claim 12 wherein at least a portion of said second plate is heavily doped n-type.

16. The memory device as described in claim 13 wherein at least a portion of said second plate is heavily doped n-type.

17. The memory device as described in claim 14 wherein said third and said fourth diffusion regions are located adjacent to one another, and wherein at least a portion of said third and said fourth regions are located adjacent to said second plate.

18. An electrically programmable and electrically erasable floating gate memory device formed on a semiconductor substrate of a first conductivity type comprising:
a first region of a second conductivity type;
a second region of said second conductivity type;
a first channel region between said first and said second region;
a gate dielectric disposed above said first channel region;
a first gate disposed above said gate dielectric;
a first capacitor, said first capacitor comprising a first doped well of said second conductivity type and a first plate capacitively coupled to said first doped well, said first plate being electrically coupled to said first gate;
a second capacitor, said second capacitor comprising a second doped well of said second conductivity type and a second plate capacitively coupled to said second doped well, said second plate being electrically coupled to said first gate; and
a select transistor comprising a second gate disposed on a second gate oxide, a third region of said second conductivity type, and a second channel region disposed beneath said third gate oxide and between said third region and said first region.

19. The device as described in claim 18 wherein said first conductivity type is p and said second conductivity type is n.

20. The memory device as described in claim 19 wherein said first doped well comprises a first and a second diffusion region and said second doped well comprises a third and a fourth diffusion region, said first and said third diffusion regions being of said second conductivity type and said second and said fourth diffusion regions being of said first conductivity type, wherein electrical contact is made to said first doped well through said first and said second diffusion regions and electrical contact is made to said second doped well through said third and said fourth diffusion regions.

21. The memory device as described in claim 19 wherein said device comprises means for electrically programming said memory device, said means for electrically programming comprising means for applying a first potential to said first doped well and a second potential to said second region, and wherein said device comprises means for electrically erasing said memory device, said means for electrically erasing comprising means for applying a third potential to said second doped well.

22. The memory device as described in claim 20 wherein said device comprises means for electrically programming said memory device, said means for electrically programming comprising means for applying a first potential to said first doped well and a second potential to said second region, and wherein said device comprises means for electrically erasing said memory device, said means for electrically erasing comprising means for applying a third potential to said second doped well.

23. The memory device as described in claim 19 wherein said first gate, said first plate and said second plate comprise a single, continuous polysilicon member.

24. The memory device as described in claim 20 wherein said first gate, said first plate and said second plate comprise a single, continuous polysilicon member.

25. The memory device as described in claim 22 wherein said first gate, said first plate and said second plate comprise a single, continuous polysilicon member.

26. The memory device as described in claim 23 wherein at least a portion of said second plate is heavily doped n-type.

27. The memory device as described in claim 24 wherein at least a portion of said second plate is heavily doped n-type.

28. The memory device as described in claim 25 wherein at least a portion of said second plate is heavily doped n-type.

29. The memory device as described in claim 26 wherein said third and said fourth diffusion regions are located adjacent to one another, and wherein at least a portion of said third and said fourth regions are located adjacent to said second plate.

30. An array of electrically programmable and electrically erasable floating gate memory devices formed on a semiconductor substrate of a first conductivity type, each of said devices comprising:
 a first region of a second conductivity type;
 a second region of said second conductivity type;
 a first channel region between said first and said second region;
 a gate dielectric disposed above said first channel region;
 a first gate disposed above said gate dielectric;
 a first capacitor, said first capacitor comprising a first doped well of said second conductivity type and a first plate capacitively coupled to said first doped well, said first plate being electrically coupled to said first gate;
 a second capacitor, said second capacitor comprising a second doped well of said second conductivity type and a second plate capacitively coupled to said second doped well, said second plate being electrically coupled to said first gate; and
 a select transistor comprising a second gate disposed on a second gate oxide, a third region of said second conducitivity type, and a second channel region disposed beneath said third gate oxide and between said third region and said first region.

31. The array as described in claim 30 wherein said array comprises a device to be programmed, wherein said array comprises means for electrically programming said device to be programmed, said means for electrically programming comprising means for applying a first potential to said first doped well and a second potential to said second region of said device to be programmed.

32. The array as described in claim 31 wherein said array is arranged in a plurality of columns and rows of said devices, wherein one of said first regions and one of said second regions extend along each of said columns, wherein said one of said first regions and said one of said second regions is common to each of said devices in each of said columns, wherein said second gate and said first well are electrically coupled in parallel to each of said devices in each of said rows, wherein said device to be programmed is located in one of said rows and one of said columns, and wherein said means for electrically programming said device to be programmed further comprises means for turning on said select transistor in said row of said device to be programmed, and means for turning off said select transistor and means for applying a fourth potential to said first doped well in all other rows than said row of said device to be programmed.

33. The array as described in claim 31 wherein said array is arranged in a plurality of columns and rows of said devices, wherein one of said first regions and one of said second regions extend along each of said columns, wherein said one of said first regions and said one of said second regions is common to each of said devices in each of said columns, wherein said second gate and said first well are electrically coupled in parallel to each of said devices in each of said rows, and wherein said device to be programmed is located in one of said rows and one of said columns, and wherein said means for electrically programming further comprises means for grounding said first region in said column of said device to be programmed and means for allowing said first region to float in all other columns, and means for applying a fifth potential to said second region in all columns other than said column of said device to be programmed.

34. The memory device as described in claim 18 further comprising means for reading said memory device, said means for reading comprising means for applying a first potential to said first doped well, means for applying a second potential to said second gate, and means for sensing a current between said first region and said second region.

35. The array as described in claim 32 wherein said means for electrically programming further comprises means for grounding said first region in said column of said device to be programmed and means for allowing said first region to float in all other columns, and means for applying a fifth potential to said second region in all columns other than said column of said device to be programmed.

36. The memory device as described in claim 30 wherein said array comprises a device to be read, wherein said array is arranged in a plurality of columns and rows of said devices, wherein one of said first regions and one of said second regions extend along each of said columns, wherein said one of said first regions and said one of said second regions is common to each of said devices in each of said columns, wherein said second gate and said first well are electrically coupled in parallel to each of said devices in each of said rows, wherein said device to be read is located in one of said rows and one of said columns, and wherein said array comprises means for reading comprising means for applying a sixth potential to said first doped well in said row of said device to be read, means for turning on said select transistor in said row of said device to be read, means for turning off said select transistor in all other rows, and means for sensing a current between said first region and said second region of said column of said device to be read.

37. The memory device as described in claim 32 wherein said array comprises a device to be read, wherein said device to be read is located in one of said rows and one of said columns, and wherein said array comprises means for reading comprising means for applying a sixth potential to said first doped well in said row of said device to be read, means for turning on said select transistor in said row of said device to be read, means for turning off said select transistor in all other rows, and means for sensing a current between said first region and said second region of said column of said device to be read.

38. The memory device as described in claim 33 wherein said array comprises a device to be read, wherein said device to be read is located in one of said rows and one of said columns, and wherein said array comprises means for reading comprising means for applying a sixth potential to said first doped well in said row of said device to be read, means for turning on said select transistor in said row of said device to be read, means for turning off said select transistor in all other rows, and means for sensing a current between said first region and said second region of said column of said device to be read.

39. The array as described in claim 30 wherein said first conductivity type is p and said second conductivity type is n and wherein said first gate, said first plate and said second plate comprise a single, continuous polysilicon member.

40. The array as described in claim 32 wherein said first conductivity type is p and said second conductivity type is n and wherein said first gate, said first plate and said second plate comprise a single, continuous polysilicon member.

41. The array as described in claim 33 wherein said first conductivity type is p and said second conductivity type is n and wherein said first gate, said first plate and said second plate comprise a single, continuous polysilicon member.

42. The array as described in claim 36 wherein said first conductivity type is p and said second conductivity type is n and wherein said first gate, said first plate and said second plate comprise a single, continuous polysilicon member.

43. The array as described in claim 30 comprising a device to be erased and comprising means for electrically erasing said device to be erased, said means for electrically erasing comprising means for applying a third potential to said second doped well of said device to be erased.

44. The array as described in claim 32 comprising a device to be erased and comprising means for electrically erasing said device to be erased, said means for electrically erasing comprising means for applying a third potential to said second doped well of said device to be erased.

45. The array as described in claim 33 comprising a device to be erased and comprising means for electrically erasing said device to be erased, said means for electrically erasing comprising means for applying a third potential to said second doped well of said device to be erased.

46. The array as described in claim 35 comprising a device to be erased and comprising means for electrically erasing said device to be erased, said means for electrically erasing comprising means for applying a third potential to said second doped well of said device to be erased.

* * * * *

UNITED STATES PATENT AND TRADEMARK OFFICE
CERTIFICATE OF CORRECTION

PATENT NO. : 5,301,150

DATED : 4/5/94

INVENTOR(S) : Stephen F. Sullivan and Neal R. Mielke

It is certified that error appears in the above-indentified patent and that said Letters Patent is hereby corrected as shown below:

Column 5; Line 40; Delete "VPG"; Insert in place thereof --VFG--

Column 9; Line 17; Delete "is"; Insert in place thereof --in--

Column 9; Line 21; Delete "hight"; Insert in place thereof --high--

Signed and Sealed this

Fourteenth Day of November, 1995

*Attest:*

BRUCE LEHMAN

*Attesting Officer*     *Commissioner of Patents and Trademarks*